(12) United States Patent
Sinha et al.

(10) Patent No.: US 7,175,214 B2
(45) Date of Patent: Feb. 13, 2007

(54) WAFER GRIPPING FINGERS TO MINIMIZE DISTORTION

(75) Inventors: Jaydeep K. Sinha, Norwood, MA (US); Domenico Tortola, Waltham, MA (US); Noel S. Poduje, Needham, MA (US)

(73) Assignee: ADE Corporation, Westwood, MA (US)

( * ) Notice: Subject to any disclaimer, the term of this patent is extended or adjusted under 35 U.S.C. 154(b) by 130 days.

(21) Appl. No.: 10/876,373

(22) Filed: Jun. 24, 2004

(65) Prior Publication Data

US 2005/0029823 A1 Feb. 10, 2005

Related U.S. Application Data

(63) Continuation-in-part of application No. 09/674,814, filed as application No. PCT/US00/06895 on Mar. 16, 2000, now abandoned.

(60) Provisional application No. 60/483,426, filed on Jun. 27, 2003.

(51) Int. Cl.
*B25J 15/08* (2006.01)
(52) U.S. Cl. .................. 294/1.1; 294/902; 414/941
(58) Field of Classification Search ............. 294/1.1, 294/103.1, 902; 414/935, 941; 901/30, 901/45
See application file for complete search history.

(56) References Cited

U.S. PATENT DOCUMENTS

| | | | |
|---|---|---|---|
| 4,603,897 A | 8/1986 | Foulke et al. ............. 294/64.1 |
| 4,717,190 A | 1/1988 | Witherspoon .............. 294/99.2 |
| 4,848,814 A * | 7/1989 | Suzuki et al. ............... 294/1.1 |
| 4,858,974 A | 8/1989 | Stannek ..................... 294/2 |
| 4,960,298 A | 10/1990 | Moroi ...................... 294/64.1 |
| 5,054,834 A | 10/1991 | Alessandri et al. ........ 294/87.1 |
| 5,280,983 A | 1/1994 | Maydan et al. ........... 294/119.1 |
| 5,765,890 A | 6/1998 | Gaylord et al. ............ 294/65 |
| 5,810,935 A | 9/1998 | Lee et al. .................. 118/728 |
| 6,491,330 B1 * | 12/2002 | Mankame et al. ........... 294/88 |
| 6,592,324 B2 * | 7/2003 | Downs et al. .............. 414/741 |

* cited by examiner

*Primary Examiner*—Dean J. Kramer
(74) *Attorney, Agent, or Firm*—Weingarten, Schurgin, Gagnebin & Lebovici LLP

(57) ABSTRACT

An apparatus for measuring semiconductor wafer shape that minimizes wafer distortion. The apparatus includes a plurality of wafer gripping fingers for holding a wafer in a predetermined position during wafer measurement. Each finger includes a groove that contacts the edge of the wafer. The groove and the wafer edge have respective radii of curvature, in which the radius of curvature of the groove is greater than that of the wafer edge. Each finger includes a rigid member having a recess formed in a central location at one end thereof, and a compliant material such as PEEK disposed in the recess in which the groove is formed. The compliant material extends a first distance beyond the rigid member at the central groove location and a second shorter distance beyond the rigid member on each side of the central location. Because the groove areas on each side of the central area are more rigid than the central groove area, the fingers can hold the wafer with a high degree of accuracy while reducing wafer distortion.

10 Claims, 7 Drawing Sheets

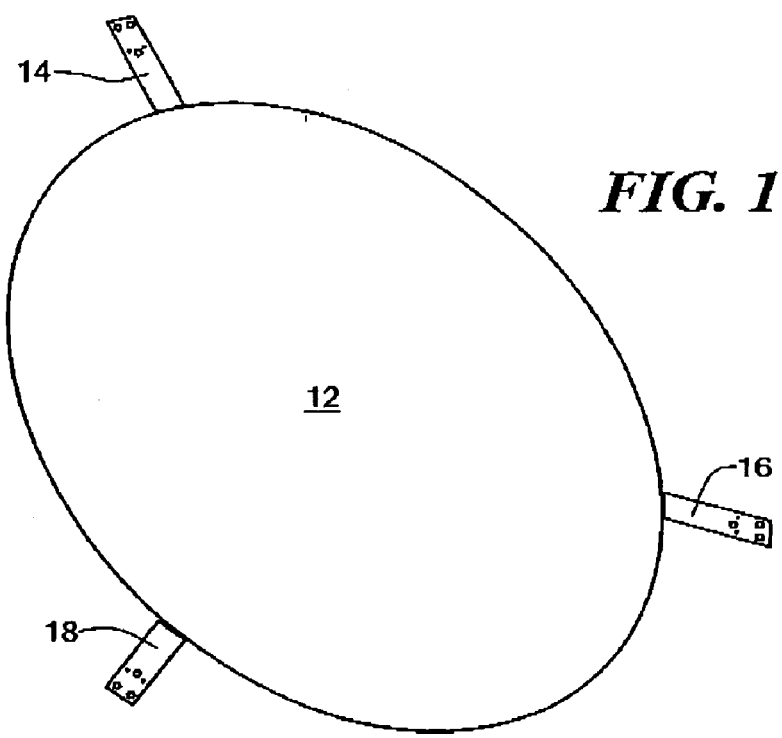
FIG. 1
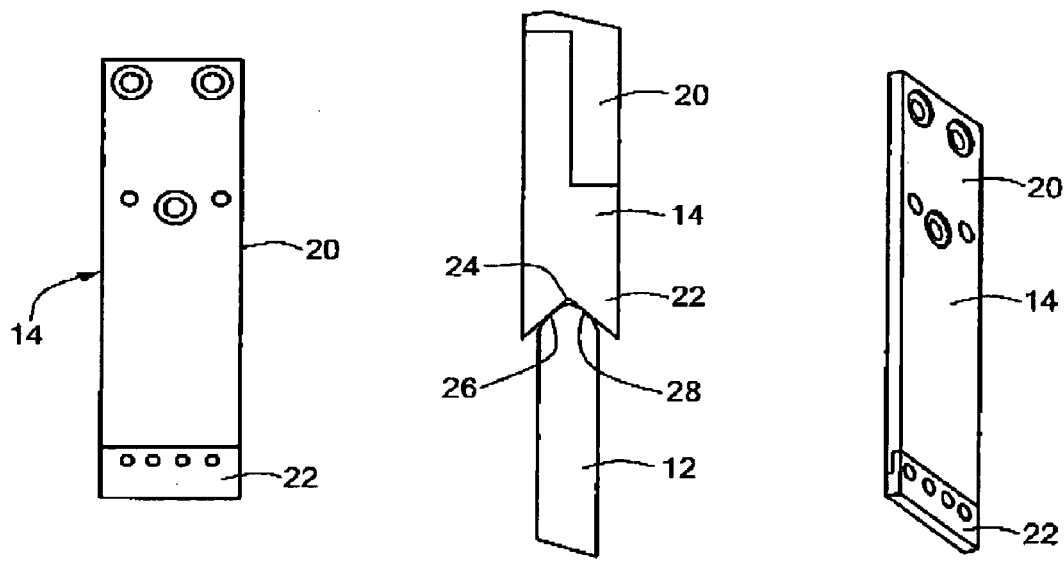
FIG. 2A - Prior art
FIG. 2B - Prior art
FIG. 2C - Prior art

WAFER GRIPPING FINGERS TO MINIMIZE DISTORTION

CROSS REFERENCE TO RELATED APPLICATIONS

This application is a continuation-in-part application of U.S. patent application Ser. No. 09/674,814 filed Mar. 16, 2000 now abandoned entitled WAFER GRIPPING FINGERS which is a 371 of PCT/US00/06895 03/16/2000. This application claims priority of U.S. Provisional Patent Application No. 60/483,426 filed Jun. 27, 2003 entitled WAFER GRIPPING FINGERS TO MINIMIZE DISTORTION.

STATEMENT REGARDING FEDERALLY SPONSORED RESEARCH OR DEVELOPMENT

N/A

BACKGROUND OF THE INVENTION

The present application relates generally to apparatus and methods of measuring the shape of a semiconductor wafer, and more specifically to apparatus and methods of measuring semiconductor wafer shape with increased accuracy.

In the manufacture of semiconductor devices, the shape of a semiconductor wafer is typically measured to determine whether the wafer conforms to predetermined criteria or standards. Such standards may relate to various wafer shape parameters including flatness, bow, and warp. In the event it is determined that a semiconductor wafer fails to conform to certain wafer shape standards, the wafer may be deemed unusable and subsequently discarded.

For example, during a semiconductor manufacturing process, semiconductor wafers may be held by wafer handling equipment in a horizontal position or in a vertical position during wafer testing and/or measurement. Such wafers are often held in the vertical position to reduce sagging of the wafer due to gravity, and to reduce wafer contamination by minimizing any horizontal surfaces of the wafer upon which particles in the air might settle. However, if a semiconductor wafer has excessive bow or warp, then results obtained from wafer testing or measurement may be inaccurate. In addition, such excessive bowing or warping of the semiconductor wafer may cause unwanted stresses to develop on thin film layers that may have been previously deposited on the wafer surface.

Not only may a semiconductor wafer exhibit excessive bow or warp, but the wafer handling equipment itself may exacerbate the bowing or warping of the wafer. For example, conventional wafer handling equipment typically includes wafer gripping fingers having V-shaped grooves configured to hold a wafer by its edges. The grooves of the wafer gripping fingers are typically made of polyetheretherketone (PEEK), which is a non-contaminating material used in various applications in the semiconductor industry. Because the V-shaped grooves may over-constrain the wafer and cause indeterminate loading at the groove/wafer contact surfaces, the grooves of the wafer gripping fingers may distort the wafer shape. For example, when the V-shaped grooves are used to hold a semiconductor wafer in a vertical position, a torque may develop that twists the wafer, thereby increasing the error in wafer shape measurements. Moreover, such loading-induced measurement error is often a function of the original shape of the wafer being measured. For this reason, it can be difficult if not impossible to separate the loading-induced error from the wafer shape parameter being measured.

It would therefore be desirable to have an apparatus and method of holding a semiconductor wafer in a wafer test or measurement station that precisely positions the wafer while minimizing any distortion in the wafer shape. Such an apparatus would position the wafer in the wafer test/measurement station so that the wafer lies within the range of the measuring instrument over a range of wafer shape parameters. It would also be desirable to have an apparatus and method of holding a wafer in a wafer test/measurement station that not only minimizes distortion of the wafer, but also provides robust wafer gripping force.

BRIEF SUMMARY OF THE INVENTION

In accordance with the present invention, an apparatus and method of measuring semiconductor wafer shape are disclosed that minimize distortion of the wafer being measured. In one embodiment, the apparatus includes a plurality of wafer gripping fingers configured to hold a semiconductor wafer in a predetermined position during wafer test or measurement. Each wafer gripping finger includes a groove configured to contact an edge of the wafer. The groove and the wafer edge have respective radii of curvature, in which the radius of curvature of the groove is greater than that of the wafer edge, thereby assuring that the wafer gripping finger contacts the wafer edge at only one point, patch, or region of the groove. In the preferred embodiment, the contact point, patch, or region is located in a central area of the groove. Further, each wafer gripping finger preferably includes a stainless steel blank having a substantially horseshoe-shaped recess formed in a central location at one end thereof. Each wafer gripping finger further includes a compliant, non-contaminating material disposed in the recess that extends beyond the full length of the end of the steel blank. In the preferred embodiment, the compliant, non-contaminating material is polyetheretherketone (PEEK). The groove is formed in the portion of the PEEK that extends beyond the end of the steel blank. Because the PEEK is disposed along the full length of the end of the steel blank, filling the centrally-located recess, the PEEK extends a first predetermined distance beyond the steel blank at the central location, and extends a second predetermined distance beyond the steel blank on each side of the recess, in which the first predetermined distance is greater than the second predetermined distance.

As a result, the central area of the groove that contacts the wafer edge is more compliant than the groove areas on each side of the central area, thereby reducing distortion of the semiconductor wafer when contacting the wafer edge. Further, because the groove areas on each side of the central area are more rigid than the central area of the groove, the plurality of wafer gripping fingers are capable of holding the semiconductor wafer with a high degree of accuracy.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which:

FIG. 1 is a perspective view of a semiconductor wafer held in position by a plurality of wafer gripping fingers;

FIGS. 2a–2c are views of a prior art wafer gripping finger;

DETAILED DESCRIPTION OF THE INVENTION

Figure 3A:
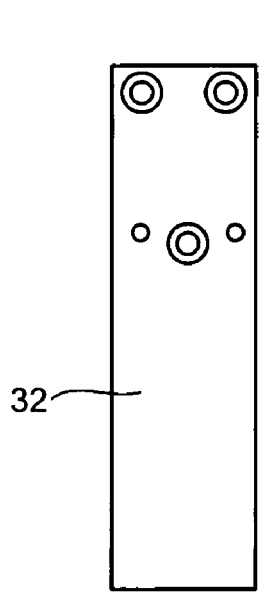
FIGS. 3a–3c are views of a wafer gripping finger having a curved groove for contacting an edge of the semiconductor wafer of FIG. 1.

U.S. patent application Ser. No. 09/674,814 filed Nov. 6, 2000 entitled WAFER GRIPPING FINGERS is incorporated herein by reference. U.S. Provisional Patent Application No. 60/483,426 filed Jun. 27, 2003 entitled WAFER GRIPPING FINGERS TO MINIMIZE DISTORTION is incorporated herein by reference.

An apparatus and method of measuring semiconductor wafer shape are disclosed that minimize distortion of the wafer being measured. The presently disclosed apparatus and method employ a plurality of wafer gripping fingers to hold a semiconductor wafer under test, in which each wafer gripping finger has a groove that contacts an edge of the wafer at one centralized point, patch, or region of the groove. Because the groove is more compliant at the central region of the groove and more rigid at distal regions of the groove on each side of the central region, the plurality of wafer gripping fingers can hold the wafer with reduced distortion and increased accuracy.

FIG. 1 depicts a wafer 12, which is typically made of a semiconductor material such as silicon. The wafer 12 is supported by three wafer gripping fingers 14, 16, and 18. Prior art versions of the fingers 14, 16, and 18 are illustrated in FIGS. 2a–2c. As shown in FIGS. 2a–2c, the fingers have a body 20 with an end section 22 having a groove 24 at the end where the wafer 12 is to be held. As shown in FIG. 2b, the groove 24 makes contact with the wafer 12 at two points 26 and 28, which are physically separated. With three fingers, there are six contact points to hold the wafer, and there is a situation of over-constraint for the wafer such that the force, torque, or stress at any one point cannot be accurately controlled. The forces are also directed out of the plane of the wafer. As a result, the wafer may experience a deforming set of forces and torques that may cause erroneous dimensional measurements.

Figure 3B:
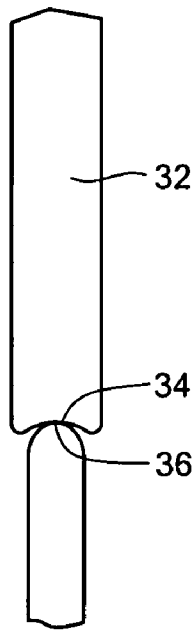
Figure 3C:
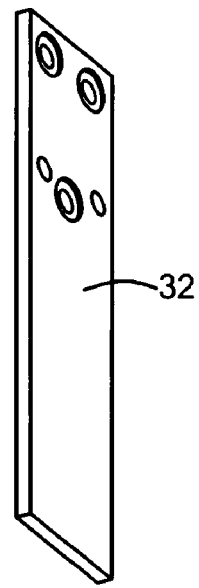

FIGS. 3a–3c depict a wafer gripping finger 32 having a groove 34 of a curved shape where the radius of curvature is greater than that of the edge of the wafer 12. The wafer makes contact at only one central point 36, which may be a patch or region of finite size. The limited single point or region of contact minimizes the deforming forces on the wafer and leads to greater accuracy in their measurement.

For example, the wafer gripping finger 32 may have the grooves coated with Teflon or any other suitable material of like low friction properties to facilitate the relaxation of friction induced forces, particularly those out of the plane of the wafer. The finger itself may also be made of such a material.

Figure 4:
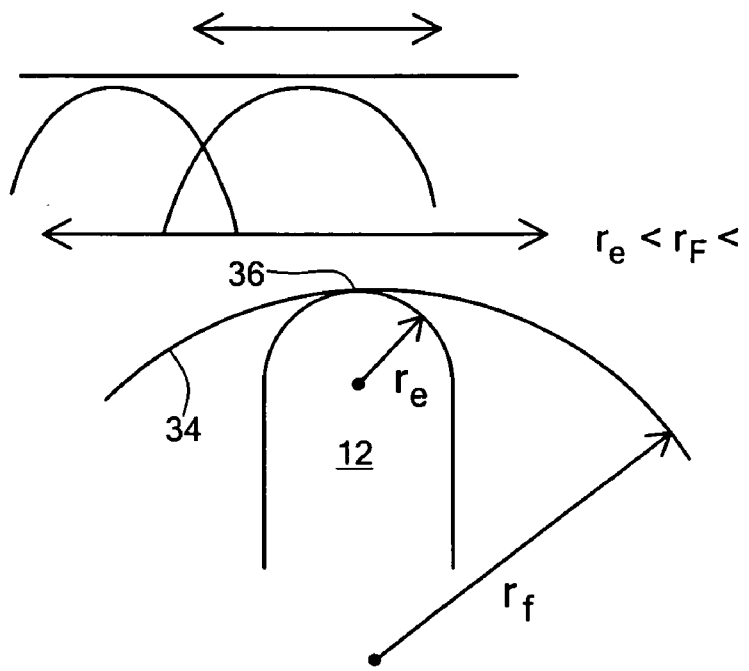
FIGS. 4–5 are diagrams illustrating considerations in the design of wafer gripping fingers according to the present invention.

FIG. 4 depicts in greater detail the contact patch 36 of the wafer and the groove 34. As shown in FIG. 4, the forces on the wafer all lie in the plane of the wafer and therefore generate little or no force capable of deforming the wafer. With a "V" shaped groove such as depicted in FIGS. 2a–2c, the points of contact apply forces out of the plane of the wafer, causing forces capable of deforming the wafer.

Figure 5:
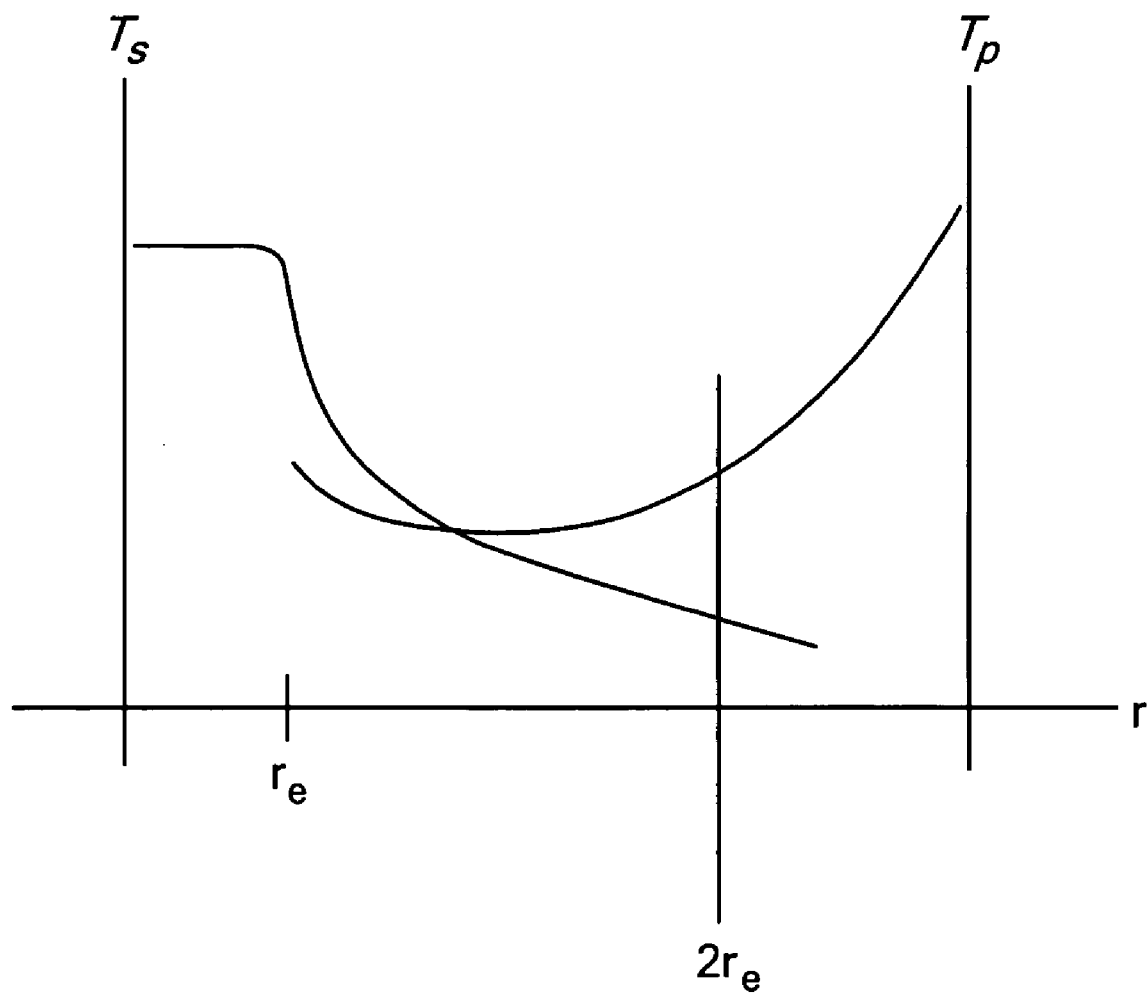

FIG. 5 is a graph of the effects of shear and in-planar forces relative to the radius of curvature of the groove, ranging from the same as the radius of curvature of the wafer edge (i.e., $r_e$) to more than two times the radius of curvature of the wafer edge. As shown in FIG. 5, the shear force drops off substantially with expanding radius of curvature of the groove.

Figure 6A:
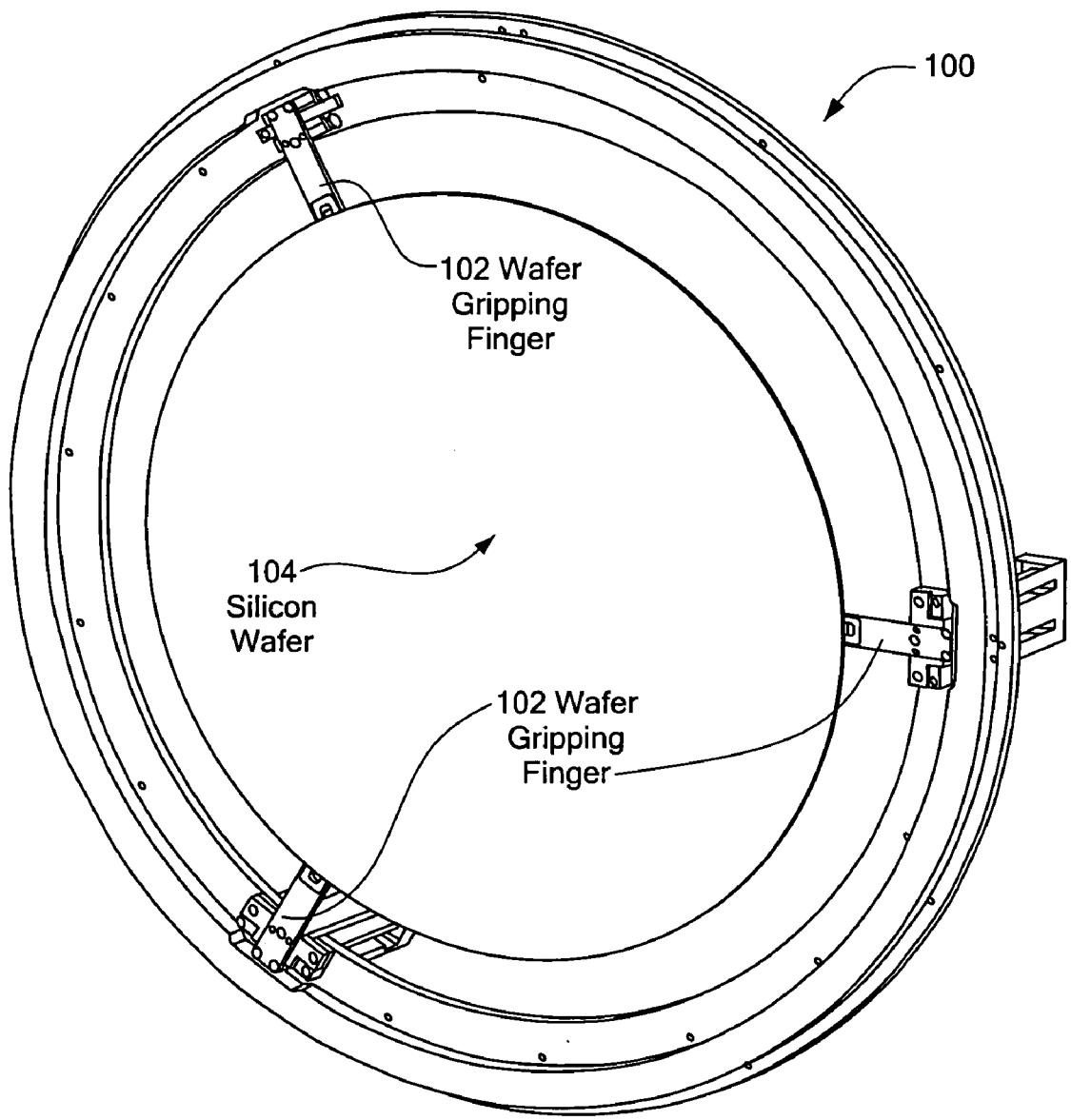
FIG. 6a is a perspective view of an apparatus for holding a semiconductor wafer according to the present invention.

FIG. 6a depicts an alternative embodiment of an apparatus 100 for holding a semiconductor wafer 104, in accordance with the present invention. In the illustrated embodiment, the wafer holding apparatus 100 includes a plurality of wafer gripping fingers 102 operative to hold the wafer 104 such as a silicon wafer in a selected position ranging from a horizontal position to a vertical position. As shown in FIG. 6a, the wafer holding apparatus 100 holds the wafer 104 in a substantially vertical position using three wafer gripping fingers 102. The wafer holding apparatus 100 may be part of a wafer transport handle, a support fixture for holding the wafer 104 at a wafer test or measurement station, or any other suitable apparatus or system for handling semiconductor wafers. For example, the wafer holding apparatus 100 may be part of a suitable dimensional measurement machine made by ADE® Corporation, Westwood, Mass., U.S.A.

Figure 6B:
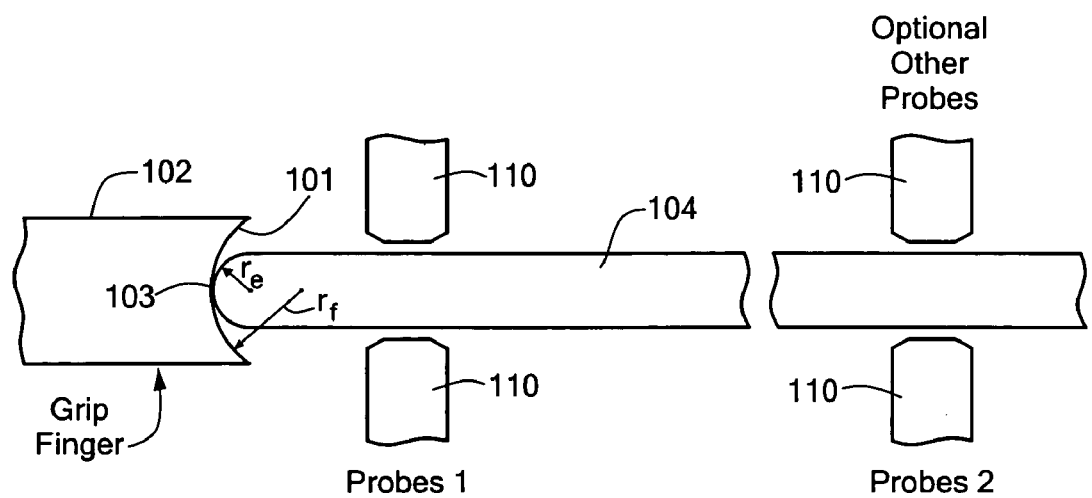
FIG. 6b is a side view of a wafer gripping finger included in the apparatus of FIG. 6a, in which the wafer gripping finger is being used to hold a semiconductor wafer for test or measurement.

FIG. 6b depicts a side view of one of the plurality of wafer gripping fingers 102 of FIG. 6a. As shown in FIG. 6b, the wafer gripping finger 102 includes a groove 101 having a substantially circular curved cross-section with a predetermined radius of curvature $r_f$. Further, the edge of the semiconductor wafer 104 has a predetermined radius of curvature $r_e$. In the preferred embodiment, the radius of curvature $r_f$ of the groove 101 is greater than the radius of curvature $r_e$ of the edge of the wafer 104. As a result, the wafer gripping finger 102 contacts the wafer edge at substantially only one point, patch, or region 103 of the groove 101 to induce a reduced amount of twist or torque on the wafer 104 during loading.

In the preferred embodiment, each wafer gripping finger 102 makes contact with the edge of the semiconductor wafer 104 in a substantially central area of the groove 101, thereby assuring that substantially all of the forces applied to the wafer 104 by the plurality of wafer gripping fingers 102 lie in the plane of the wafer 104. Such applied forces lying in the plane of the wafer 104 are essentially incapable of deforming the wafer 104. As a result, one or more conventional measurement probes 110 (e.g., probes 1–2; see FIG. 6b) may be employed to measure wafer shape parameters such as flatness, bow, and/or warp with less loading-induced measurement error.

Figure 7:
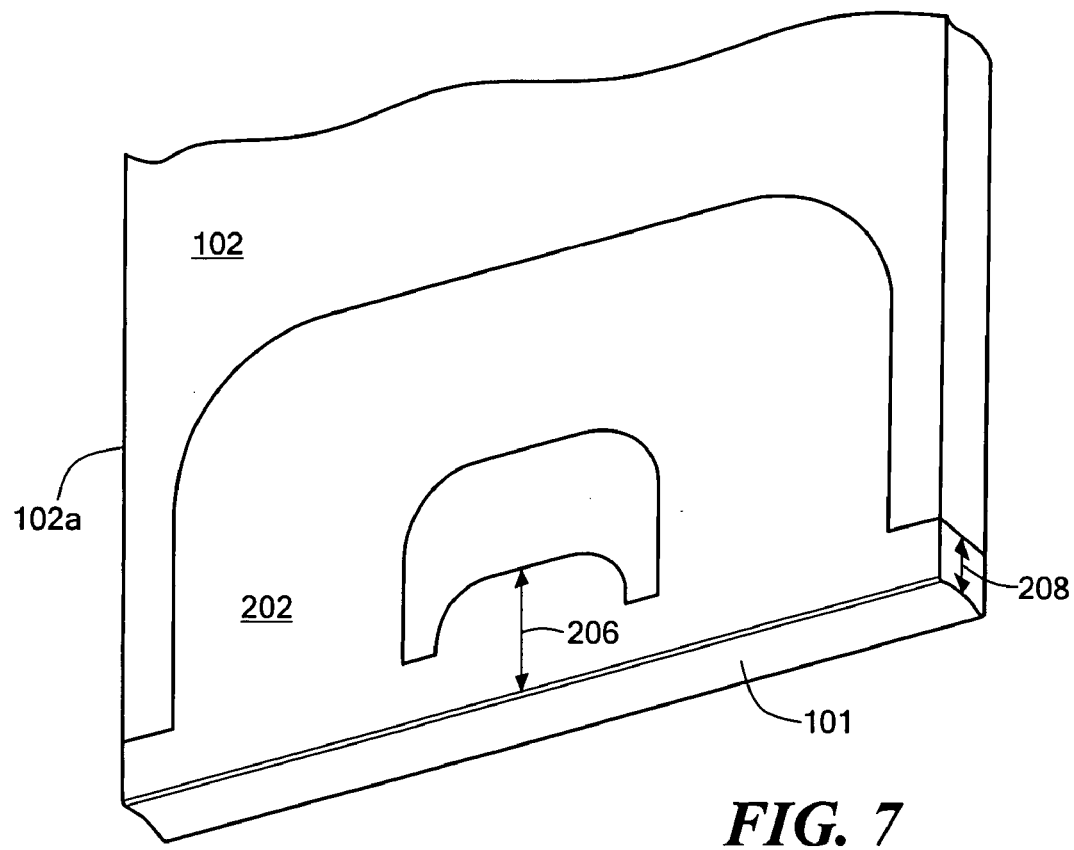
FIG. 7 is a perspective view of the wafer gripping finger of FIG. 6b.

FIG. 7 depicts a detailed view of one of the wafer gripping fingers 102 (see also FIG. 6a). In the illustrated embodiment, the wafer gripping finger 102 includes a rigid member 102a, and a compliant, non-contaminating material 202 disposed on the rigid member 102a in which the curved groove 101 is formed. For example, the rigid member 102a may comprise a metal blank made of stainless steel or any other suitable material. Further, the compliant, non-contaminating material 202 may be polyetheretherketone (PEEK) or any other suitable material. Moreover, the PEEK material 202 may be disposed on the steel blank 102a, and the groove 101 may be formed in the PEEK material 202, by an injection molding process or any other suitable manufacturing process. In the preferred embodiment, the injection molding process is employed to assure that all of the wafer gripping fingers 102 included in the wafer holding apparatus 100 are substantially identical. As shown in FIG. 7, the PEEK 202 extends beyond the end of the steel blank 102a by a first predetermined distance 206 at a central location of the groove 101, and by a second predetermined distance 208 at opposing ends of the groove 101, in which the distance 206 is greater than the distance 208.

Accordingly, the central area of the groove 101 is more compliant than the distal areas at opposing ends of the groove 101 due to the increased thickness of the PEEK material 202 at the central location, as indicated by the predetermined distance 206. Further, the distal areas of the groove 101 are more rigid than the central area of the groove 101 due to the reduced thickness of the PEEK material 202 at the distal locations, as indicated by the predetermined distance 208.

Because each wafer gripping finger 102 makes contact with the edge of the semiconductor wafer 104 (see FIG. 6a) at the more compliant central area of the groove 101, distortion and wear of the wafer is reduced. In addition, because the groove 101 is more rigid on each side of the central area of the groove, particularly at the distal areas of the groove, the plurality of wafer gripping fingers 102 are capable of holding and positioning the wafer with a high degree of accuracy. It is noted that the reduced thickness of the PEEK material 202 in the distal regions of the groove 101 increases the structural strength of the wafer gripping finger 102.

Figure 8:
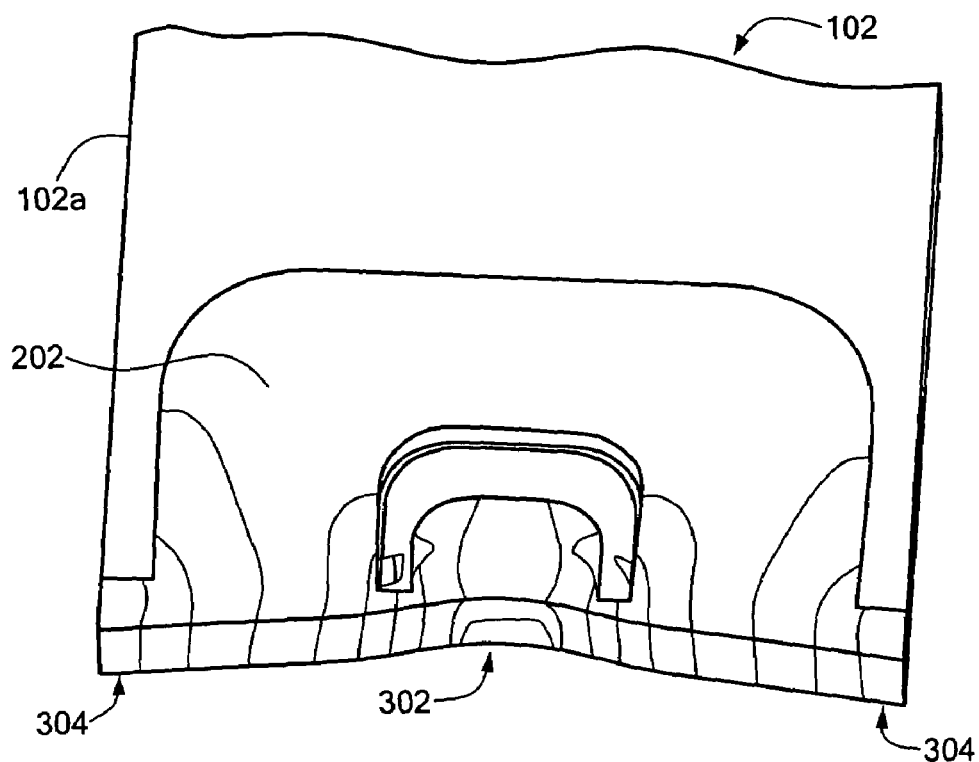
FIGS. 8–9 depict simulated stress concentrations in the wafer gripping finger of FIG. 6b when holding a semiconductor wafer for test or measurement.

FIG. 8 illustrates simulated stress concentrations in the wafer gripping finger 102 when holding the semiconductor wafer 104 for test or measurement purposes (see also FIG. 6a). For example, such simulations of stress concentrations in the wafer gripping finger may be obtained using ANSYS™ finite element analysis software or any other suitable software analysis tool. The multiple regions of simulated stress concentrations depicted in FIG. 8 correspond to a loading force of about 3.5 kg applied to the wafer by the wafer gripping finger, which causes a deflection of about 25 nm in the compliant central area of the groove, as indicated by reference numeral 302. The stress concentration is highest in the central area 302 of the groove, and is gradually reduced moving from the central area 302 toward the distal areas of the groove, as indicated by reference numerals 304.

Figure 10:
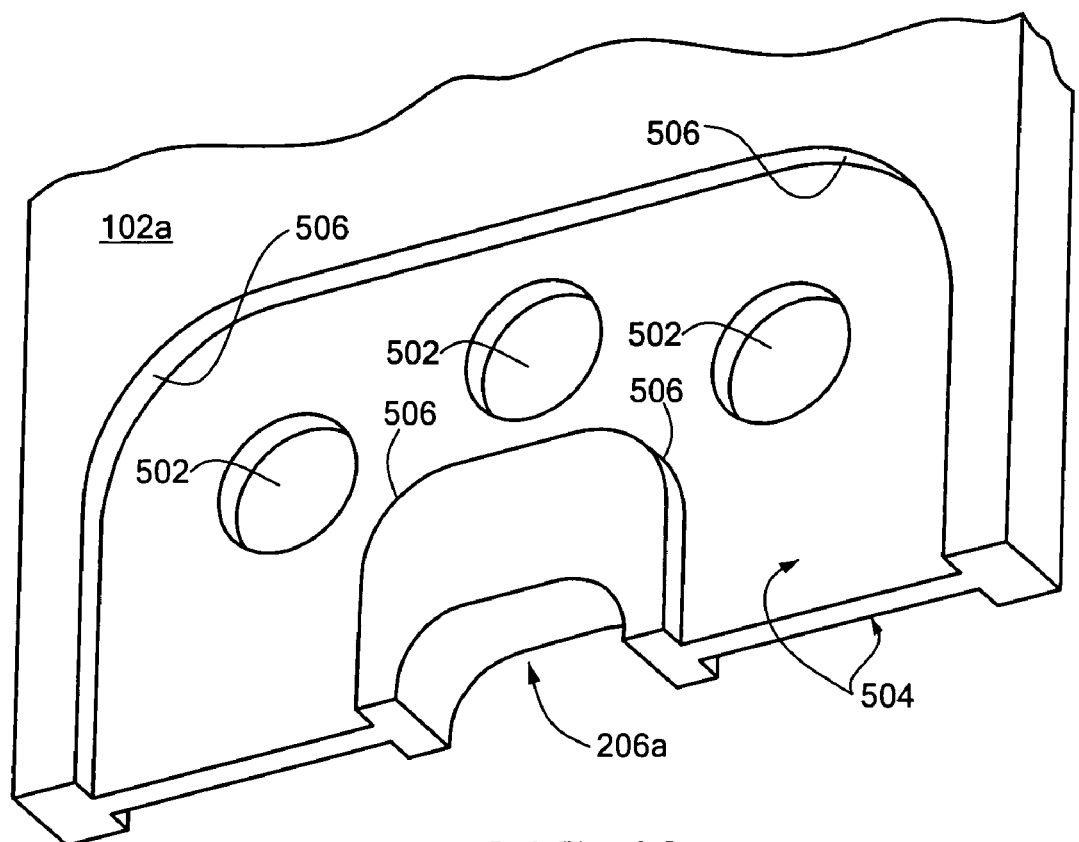
FIG. 10 is a perspective view of a stainless steel blank included in the wafer gripping finger of FIG. 6b.

FIG. 10 depicts a detailed view of the stainless steel blank 102a included in the wafer gripping finger 102 (see also FIG. 6a). In the illustrative embodiment, the steel blank 102a includes substantially horseshoe-shaped recesses 504 formed in opposing sides of the blank 102a. As shown in FIG. 10, a plurality of holes 502 is formed through the steel blank 102a within the recessed area 504. As a result, when the PEEK material 202 is disposed in the recesses 504 of the steel blank 102a, the PEEK material 202 flows through the plurality of holes 502 to interlock onto the steel blank 102a. In this way, a substantially closed frame of PEEK material is formed for better structural adherence to the steel blank 102a. The steel blank 102a further includes a cavity 206a, which allows the PEEK material 202 to accumulate in the vicinity of the central area of the groove 101 where the wafer gripping finger 102 makes contact with the wafer (see FIG. 7). For example, suitable dimensions of the cavity 206a may be determined to achieve the predetermined thickness 206 (see FIG. 7) of the PEEK material 202 based on a given force applied to the wafer by the wafer gripping finger.

Figure 9:
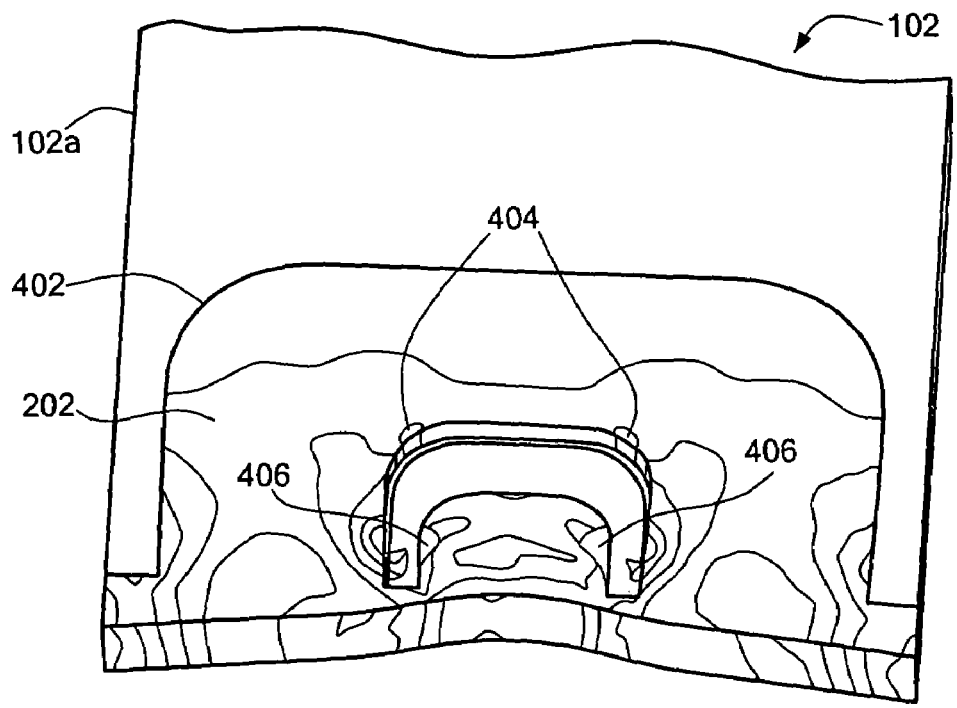
Figure 11:
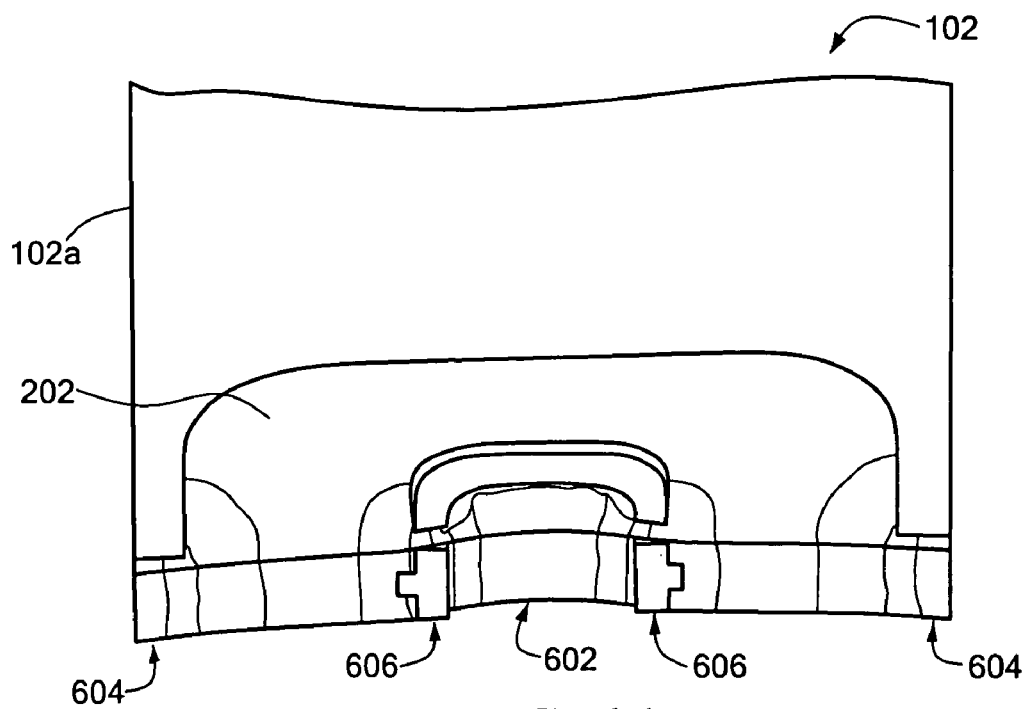
FIG. 11 depicts simulated stress concentrations in the wafer gripping finger of FIG. 6b when representative thicknesses of PEEK material are employed in the wafer gripping finger.

In the preferred embodiment, the recesses 504 and the cavity 206a formed in the steel blank 102a have a plurality of rounded corners 506 (see FIG. 10) that operate to reduce the magnitude of the stress concentrations in the PEEK material 202 (see FIG. 7), thereby preventing premature failure of the wafer gripping fingers. FIGS. 9 and 11 illustrate simulated stress concentrations in the wafer gripping finger 102 when holding the semiconductor wafer for test or measurement. As described above with reference to FIG. 8, such simulations of stress concentrations in the wafer gripping finger may be obtained using ANSYS™ finite element analysis software or any other suitable software analysis tool. As shown in FIG. 9, the magnitude of the stress concentrations in the PEEK material 202 is reduced in areas adjacent the rounded corners of the recesses 504 (see reference numerals 402 and 404) and in areas near the rounded corners of the cavity 206a (see reference numerals 406), as indicated by the dark shading at these locations.

The preferred thicknesses 206 and 208 of the PEEK material 202 (see FIG. 7) may be determined based on a given force applied to a semiconductor wafer by the wafer gripping fingers 102 (see FIG. 6a). For example, the preferred thickness 208 of the PEEK material 202 may be determined to be about 0.8 mm. FIG. 11 depicts simulated stress concentrations in the wafer gripping finger 102 when holding the wafer, in the event the PEEK material thickness 208 is about one half of the exemplary thickness of 0.8 mm, i.e., about 0.4 mm. The multiple regions of simulated stress concentrations depicted in FIG. 11 correspond to a loading force of about 2 kg applied to the wafer by the wafer gripping finger 102.

The stress concentration is highest in the central area 602 of the groove, and is reduced in the distal areas of the groove, as indicated by reference numerals 604. Moreover, in this illustrative example, indications of the steel blank 102a (see FIG. 10) can be observed due to the less than optimal PEEK thickness 208, as indicated by reference numerals 606. For example, the PEEK material in the central region 602 of the groove may distort across the steel blank portions 606, which may cause undesirable distortion and/or contamination of the wafer. It should be noted, however, that if the PEEK material thickness 208 were about two times the exemplary preferred thickness of 0.8 mm, i.e., about 1.6 mm, then the wafer may become unstable while being held by the wafer gripping fingers, even though wafer distortion, contamination, and wear may be reduced. Accordingly, the thickness of the PEEK material employed by the wafer gripping fingers 102 may be optimized based at least in part on the loading conditions of the wafer and the requirements of the dimensional measurement machine.

The presently disclosed wafer gripping fingers 102 (see FIG. 6a) may be employed in applications where the semiconductor wafers to be measured are to be precisely held with low distortion and high loading accuracy. Because of the reduction in the contact area between each wafer gripping finger and the wafer edge, and the choice of the material used to form the finger grooves, wafer contamination is minimized. Further, because the radius of curvature of the finger grooves is greater than that of the wafer edge, wafer twisting and distortion are reduced. The curved grooves of the wafer gripping fingers, which are preferably made of molded PEEK material, improve the manufacturability, reliability, and loading accuracy of the wafer gripping fingers.

It will further be appreciated by those of ordinary skill in the art that modifications to and variations of the above-described wafer gripping fingers to minimize distortion may be made without departing from the inventive concepts disclosed herein. Accordingly, the invention should not be viewed as limited except as by the scope and spirit of the appended claims.

What is claimed is:

1. A semiconductor wafer handling apparatus, comprising:
    a plurality of wafer gripping fingers configured to hold a semiconductor wafer in a predetermined position, the wafer having an edge, each wafer gripping finger including a rigid member and a compliant portion disposed across an end of the rigid member, the compliant portion having a groove formed thereon, the groove having a central region and respective distal regions at opposite ends of the groove, the central region of the groove being configured to contact the edge of the wafer,
    wherein the compliant portion of each wafer gripping finger has a first predetermined thickness at the central region of the groove and a second predetermined thickness at the distal regions of the groove, the first predetermined thickness being greater than the second predetermined thickness, and
    wherein the groove has a predetermined radius of curvature.

2. The apparatus of claim 1 wherein the wafer edge has a predetermined radius of curvature, the radius of curvature of the groove being greater than the radius of curvature of the wafer edge.

3. The apparatus of claim 1 wherein the central region of the groove is configured to contact the wafer edge at a centralized patch.

4. The apparatus of claim 1 wherein the rigid member of each wafer gripping finger is made of steel.

5. The apparatus of claim 1 wherein the compliant portion of each wafer gripping finger is made of polyetheretherketone (PEEK).

6. A method of handling a semiconductor wafer, comprising the steps of:
    holding the semiconductor wafer in a predetermined position by a plurality of wafer gripping fingers, the wafer having an edge, each wafer gripping finger including a rigid member and a compliant portion disposed across an end of the rigid member, the compliant portion having a groove formed thereon, the groove having a central region and respective distal regions at opposite ends of the groove,
    wherein the central region of the groove contacts the edge of the wafer,
    wherein the compliant portion of each wafer gripping finger has a first predetermined thickness at the central region of the groove and a second predetermined thickness at the distal regions of the groove, the first predetermined thickness being greater than the second predetermined thickness, and
    wherein the groove has a predetermined radius of curvature.

7. The method of claim 6 wherein the wafer edge has a predetermined radius of curvature, the radius of curvature of the groove being greater than the radius of curvature of the wafer edge.

8. The method of claim 6 further including the step of contacting the wafer edge at a centralized patch of the central region of the groove.

9. The method of claim 6 wherein the rigid member of each wafer gripping finger is made of steel.

10. The method of claim 6 wherein the compliant portion of each wafer gripping finger is made of polyetheretherketone (PEEK).

* * * * *